US012289848B2

United States Patent
Ho

(10) Patent No.: US 12,289,848 B2
(45) Date of Patent: Apr. 29, 2025

(54) MOBILE DISPLAY DEVICE

(71) Applicant: OXTI Pte Ltd, Singapore (SG)

(72) Inventor: Chih-Feng Ho, Singapore (SG)

(73) Assignee: OXTI PTE LTD, Singapore (SG)

( * ) Notice: Subject to any disclaimer, the term of this patent is extended or adjusted under 35 U.S.C. 154(b) by 223 days.

(21) Appl. No.: 18/137,425

(22) Filed: Apr. 20, 2023

(65) Prior Publication Data

US 2024/0357758 A1 Oct. 24, 2024

(51) Int. Cl.
*H05K 5/02* (2006.01)
*H05K 5/03* (2006.01)

(52) U.S. Cl.
CPC ......... *H05K 5/0247* (2013.01); *H05K 5/0234* (2013.01); *H05K 5/03* (2013.01)

(58) Field of Classification Search
None
See application file for complete search history.

(56) References Cited

U.S. PATENT DOCUMENTS

| 5,797,666 | A * | 8/1998 | Park | A47B 21/0073 312/223.3 |
|---|---|---|---|---|
| 9,778,707 | B1 * | 10/2017 | San Clemente | G06F 1/182 |
| 9,918,550 | B1 * | 3/2018 | Taylor | A47B 88/40 |
| 10,875,561 | B1 * | 12/2020 | Marker | B62B 3/04 |
| 11,457,726 | B2 * | 10/2022 | Wallis | A47B 21/03 |
| 2012/0212116 | A1 * | 8/2012 | McRorie | A61B 50/13 312/249.13 |
| 2013/0279090 | A1 * | 10/2013 | Brandt | F16M 11/04 361/679.01 |
| 2018/0012209 | A1 * | 1/2018 | Barnes | H05K 5/03 |
| 2018/0168334 | A1 * | 6/2018 | Swartz | F16M 11/046 |
| 2023/0418331 | A1 * | 12/2023 | Matheson | F16M 11/28 |

* cited by examiner

*Primary Examiner* — Xanthia C Relford
(74) *Attorney, Agent, or Firm* — Leong C. Lei

(57) ABSTRACT

A mobile display device includes: a movable base having a first receiving space and a second receiving space and including a back board, a bottom board, on which a plurality of movement casters are mounted, a top board, in which an opening is formed, and two lateral boards, and further including a first movable shielding cover; an elevation device arranged in the second receiving space and including an extendible/contractable rod, and a display device arranged on the extendible/contractable rod; a plurality of electrical power supply devices arranged in the first receiving space and supplying electrical power to the elevation device and the display device. With the electrical power supply devices being arranged in the first receiving space and supplying power to the elevation device and the display device, the display device is allowed to move in the vertical direction through the opening and an effect of arbitrarily placing is achieved.

5 Claims, 5 Drawing Sheets

MOBILE DISPLAY DEVICE

TECHNICAL FIELD OF THE INVENTION

The present invention relates generally to a display device, and more particularly to a mobile display device.

DESCRIPTION OF THE PRIOR ART

Movable television sets are available in the market, such as Taiwan Utility Model M536310. The Utility Model, as shown in FIG. 1 thereof, is generally made up of a main body and an elevation mechanism. The main body includes a first receiving portion, a first horizontal rail, a guide channel, and a connecting block. The elevation mechanism is arranged in the first receiving portion, and elevation mechanism includes two vertical rail sets, a movable link assembly, a linear actuator, and a carrier unit. By means of combination of such components, the Utility Model realizes elevation and lowering of a display on the carrier unit.

Although an effect of elevation and lowering of the display, it has to be arranged at a location close to a wall socket, or an extension cord must be used for operation at a location far away from the wall socket. This arrangement makes the extension cord vulnerable to influence of external forces (such as being treaded or run over) to thereby cause the extension cord to break. Further, as the total weight includes the display, the main body, and the elevation mechanism, implementation of moving or transporting is inconvenient.

SUMMARY OF THE INVENTION

In view of the above problems, an objective of the present invention is to provide a mobile display device.

To achieve the above objective, the present invention provides a mobile display device, which comprises:
  a movable base, the movable base comprising a first receiving space and a second receiving space, the movable base comprising a back board, the movable base comprising a bottom board, the bottom board being provided with a plurality of movement casters, the movable base comprising a top board, the top board being formed with an opening, the movable base comprising two lateral boards, the movable base comprising a first movable shielding cover, the first movable shielding cover being arranged between the two lateral boards and adjacent to the bottom board;
  an elevation device, the elevation device being arranged in the second receiving space, the elevation device being fixed to the bottom board, the elevation device comprising an extendible/contractable rod, the elevation device being provided with a display device, the display device being arranged on the extendible/contractable rod, the display device being movable vertically by means of the extendible/contractable rod to extend through the opening to an outside of the movable base; and
  a plurality of electrical power supply devices, the electrical power supply devices being arranged in the first receiving space, the electrical power supply devices supplying electrical power to the elevation device and the display device, wherein due to arrangement of the plurality of electrical power supply device, operation time of the elevation device and the display device are extended.

By arranging the electrical power supply devices in the first receiving space, and the electrical power supply devices supplying electrical power to the elevation device and the display device, the display device is allowed to move in the vertical direction through the opening to achieve an effect of arbitrarily placing the movable base at any random location without being located around an electrical socket, and the bottom board is provided with the plurality of movement casters to achieve an effect of easy mobility.

DETAILED DESCRIPTION OF THE PREFERRED EMBODIMENT

Figure 1:
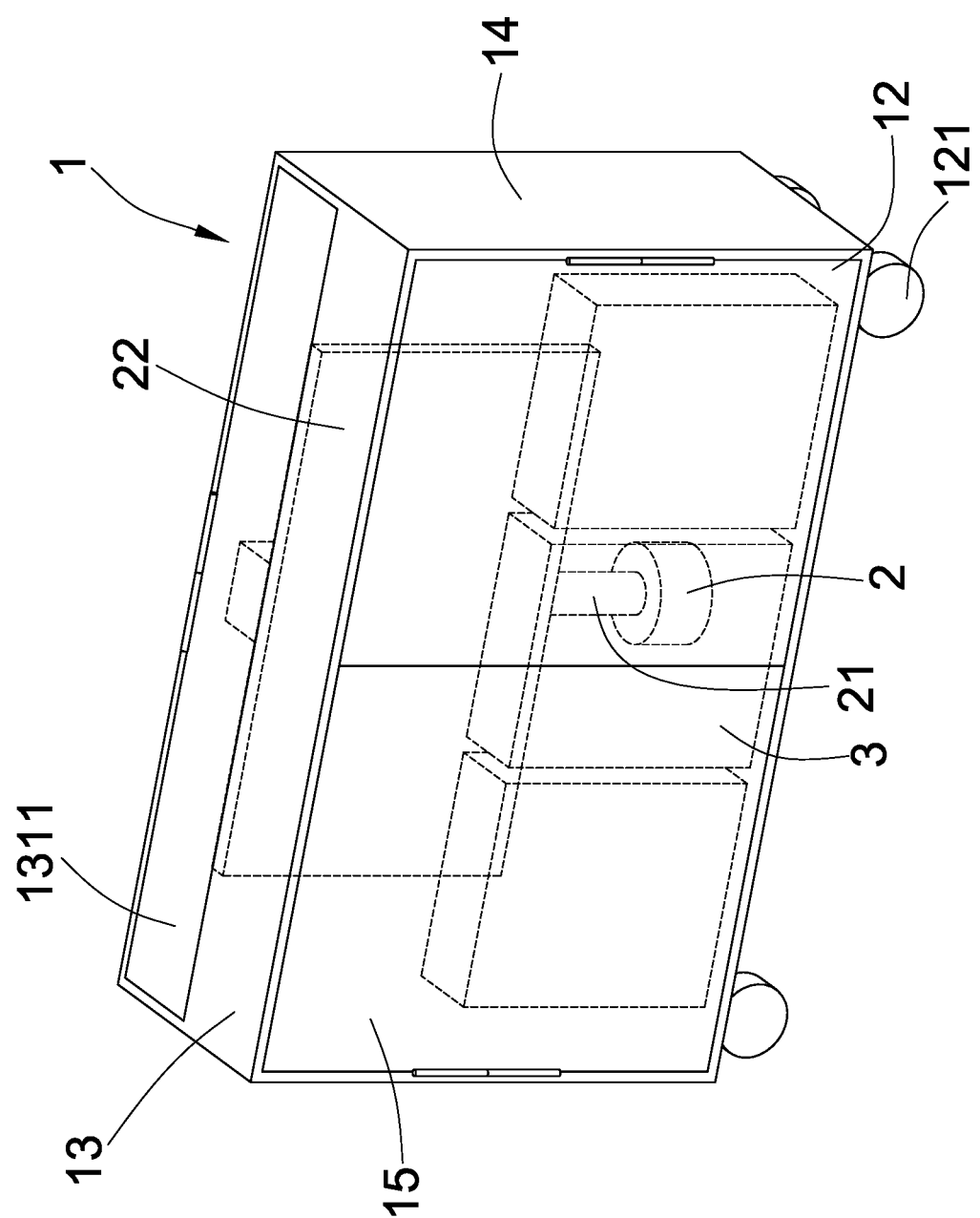
FIG. 1 is a schematic view showing a state of the present invention before use.
Figure 2:
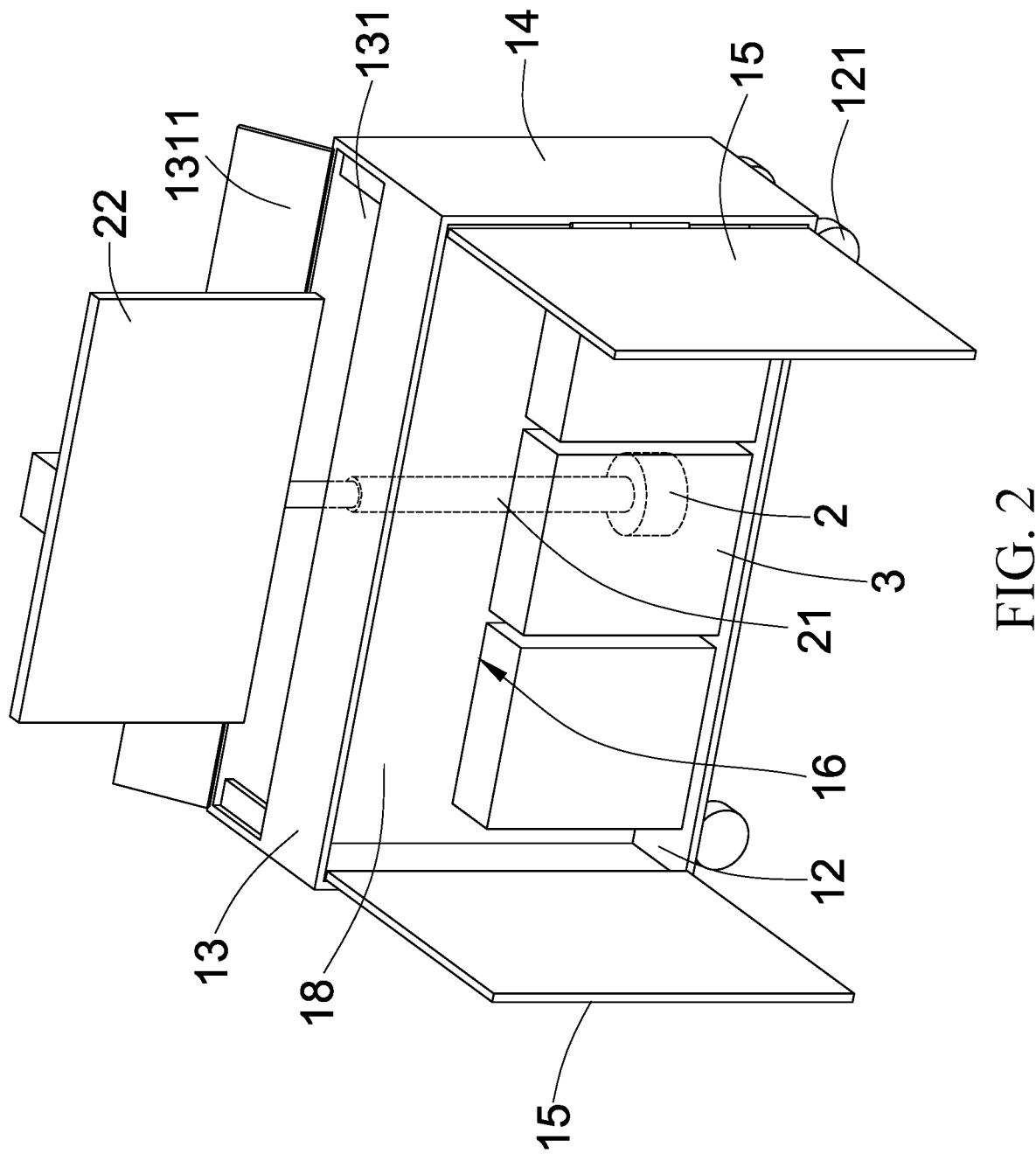
FIG. 2 is a schematic view showing a state of the present invention after use.
Figure 3:
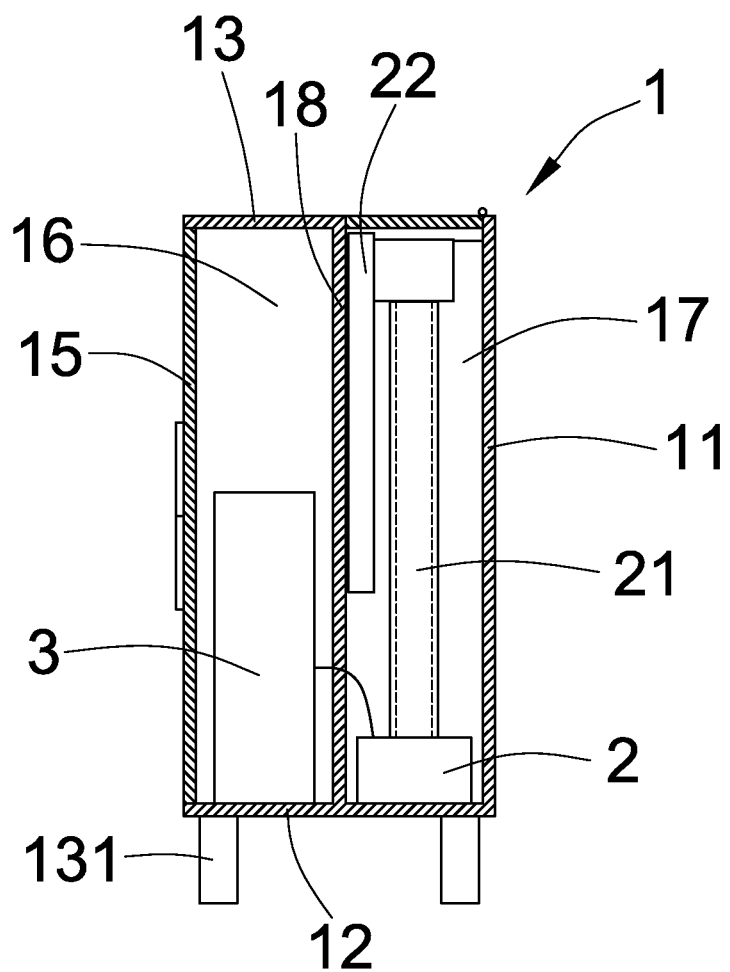
FIG. 3 is a side view showing the present invention before being operated.
Figure 4:
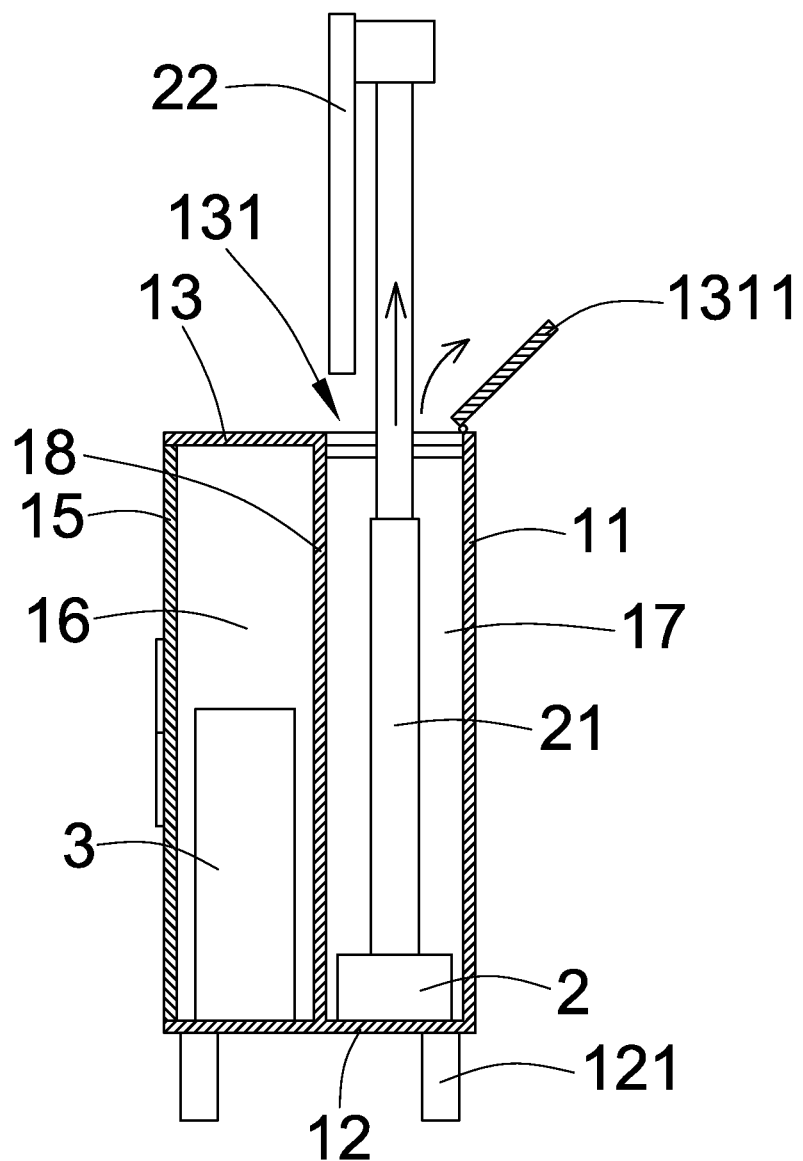
FIG. 4 is a side view showing the present invention after being operated.

Referring to FIGS. 1, 2, and 3, a mobile display device, comprises:
  a movable base 1, wherein the movable base 1 is formed with a first receiving space 16 and a second receiving space 17, and the movable base 1 comprises a back board 11, and the movable base 1 comprises a bottom board 12, the bottom board 12 being provided with a plurality of movement casters 121, and further, the movable base 1 comprises a top board 13, the top board 13 being formed with an opening 131, and the movable base 1 comprises two lateral boards 14, and further, the movable base 1 comprises a first movable shielding cover 15, the first movable shielding cover 15 being arranged between the two lateral boards 14 and adjacent to the bottom board 12,
  wherein the first movable shielding cover 15 can be a slide door or other openable door arrangements; and
  an elevation device 2, wherein the elevation device 2 is arranged in the second receiving space 17, and the elevation device 2 is fixed to the bottom board 12, and the elevation device 2 comprises an extendible/contractable rod 21, and further, the elevation device 2 is provided with a display device 22, the display device 22 being arranged on the extendible/contractable rod 21, the display device 22 being movable vertically by means of the extendible/contractable rod 21 to extend through the opening 131 to an outside of the movable base 1,
  wherein the opening 131 is provided with a second movable shielding cover 1311, and the second movable shielding cover 1311 can be a lift cover, so that to extend the display device 22 through the opening 131, the second movable shielding cover 1311 can be opened to allow the extension of the display device 22 through the opening 131, and to retract the display device 22 back into the movable base 1, the second movable shielding cover 1311 can be closed in combination therewith, in order to prevent foreign objects from falling into the movable base 1 and to achieve effects of dust prevention and protection (as shown in FIGS. 3 and 4), wherein the elevation device 2 is mounted on the back board 11 so as to more securely fix the elevation device 2, wherein the elevation device 2 may comprise a chain-sprocket mechanism or an electrically driven push rod mechanism or a hydraulically driven push rod or a screw-based push rod, and wherein the display device 22 comprises a display screen; and a plurality of electrical power supply device 3, wherein the electrical power supply devices 3 are arranged in the first receiving space 16, and the electrical power supply devices 3 are operable to supply electrical power to the elevation device 2 and the display device 22, and to extend operation time of the elevation device 2 and the display device 22, wherein a partition board 18 is arranged between the first receiving space 16 and the second receiving space 17, and wherein the electrical power supply devices 3 may comprise an all-solid-state battery, and compared to a known lithium ion battery, the all-solid-state battery can be charged rapidly, has an extended service life, and is durable for low temperature to high temperature, and has a high degree of freedom for shape and a larger capacity and power.

Figure 5:
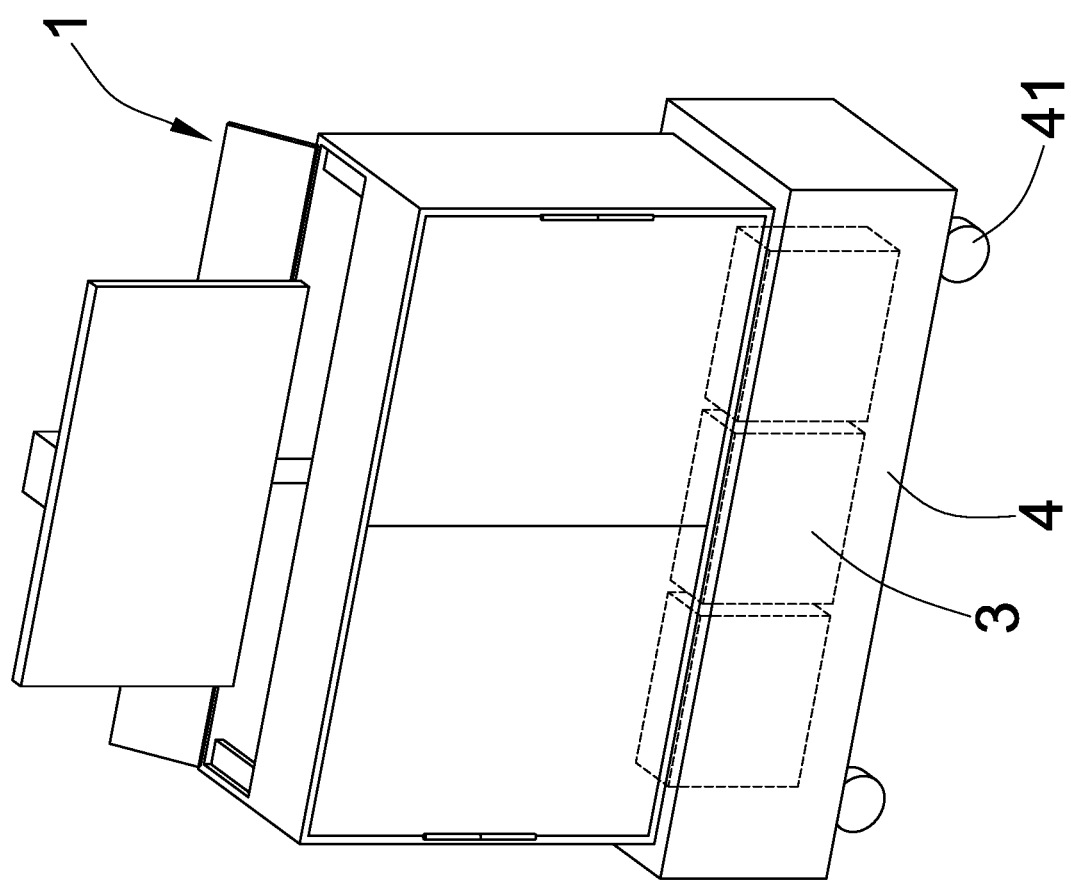
FIG. 5 is a schematic view showing the present invention in combination with a stand.

Referring to FIG. 5, the movable base 1 is provided, on an underside thereof, with a stand 4, and the stand 4 may receive more electrical power supply device 3 to dispose therein. The stand 4 is provided with movement casters 41.

Since the present invention includes a plurality of electrical power supply devices 3, the present invention may achieve an effect of being an outdoor mobile advertisement wall without any extension cord to connect with a wall socket, or the present invention can be used in a music concert to serve as a measure for conveying an image of the concert to people sitting at a remote location, and also, the present invention, due to multiple electrical power supply devices 3 included therein, may serve as a mobile power supply station.

By arranging a plurality of electrical power supply devices 3 on the bottom board 12 inside the movable base 1, with the electrical power supply device 3 supplying electrical power to the elevation device 2 and the display device 22, the display device 22 is allowed to move in the vertical direction to extend through the opening 131, thereby achieving an effect of long term operation of the display device 22 without placing the movable base 1 around an electrical socket, and can be placed at any location, and by means of the plurality of movement casters 121 provided on the bottom board 12, an effect of easy mobility is achieved.

I claim:

1. A mobile display device, comprising:
a movable base, the movable base comprising a first receiving space and a second receiving space, the movable base comprising a back board, the movable base comprising a bottom board, the bottom board being provided with a plurality of movement casters, the movable base comprising a top board, the top board being formed with an opening, the movable base comprising two lateral boards, the movable base comprising a first movable shielding cover, the first movable shielding cover being arranged between the two lateral boards and adjacent to the bottom board;

an elevation device, the elevation device being arranged in the second receiving space, the elevation device being fixed to the bottom board, the elevation device comprising an extendible/contractable rod, the elevation device being provided with a display device, the display device being arranged on the extendible/contractable rod; and a plurality of electrical power supply devices, the electrical power supply devices being arranged in the first receiving space, the electrical power supply devices supplying electrical power to the elevation device and the display device.

2. The mobile display device according to claim 1, wherein the movable base is provided, on an underside thereof, with a stand, and the stand is provided with movement casters.

3. The mobile display device according to claim 1, wherein a partition board is arranged between the first receiving space and the second receiving space.

4. The mobile display device according to claim 1, wherein the opening is provided with a second movable shielding cover, and the second movable shielding cover comprises a lift cover.

5. The mobile display device according to claim 1, wherein the electrical power supply devices comprise an all-solid-state battery.

\* \* \* \* \*